United States Patent

Lee et al.

[11] 4,051,405
[45] Sept. 27, 1977

[54] METHOD FOR CONTROLLING LOW-ENERGY HIGH CURRENT DENSITY ELECTRON BEAMS

[75] Inventors: John N. Lee, Silver Spring; Robert B. Oswald, Jr., Bethesda, both of Md.

[73] Assignee: The United States of America as represented by the Secretary of the Army, Washington, D.C.

[21] Appl. No.: 612,053

[22] Filed: Sept. 10, 1975

[51] Int. Cl.$^2$ .................. H01J 1/00; H05H 1/00
[52] U.S. Cl. ........................ 313/361; 313/295; 313/360; 313/363; 250/398; 250/400
[58] Field of Search ............ 313/361, 363, 360, 295; 250/398, 400; 328/256

[56] References Cited

U.S. PATENT DOCUMENTS

| | | | |
|---|---|---|---|
| 2,214,808 | 9/1940 | Burnside | 313/295 UX |
| 2,220,840 | 11/1940 | Metcalf | 328/256 X |
| 2,235,498 | 3/1941 | Herold | 313/295 |
| 2,272,844 | 2/1942 | Jonker | 313/295 X |
| 2,544,226 | 3/1951 | Herold | 313/295 X |
| 2,772,364 | 11/1956 | Washburn | 313/363 X |
| 2,774,008 | 12/1956 | Rooks | 313/361 X |
| Re. 22,576 | 12/1944 | Freeman | 313/295 X |

Primary Examiner—Stanley T. Krawczewicz
Attorney, Agent, or Firm—Nathan Edelberg; Robert P. Gibson; Saul Elbaum

[57] ABSTRACT

A method and an apparatus for controlling the angle of incidence of low-energy, high current density electron beams are disclosed. The apparatus includes a current generating diode arrangement with a mesh anode for producing a drifting electron beam. An auxiliary grounded screen electrode is placed between the anode and a target for controlling the average angle of incidence of electrons in the drifting electron beam. According to the method of the present invention, movement of the auxiliary screen electrode relative to the target and the anode permits reliable and reproducible adjustment of the average angle of incidence of the electrons in low energy, high current density relativistic electron beams.

6 Claims, 1 Drawing Figure

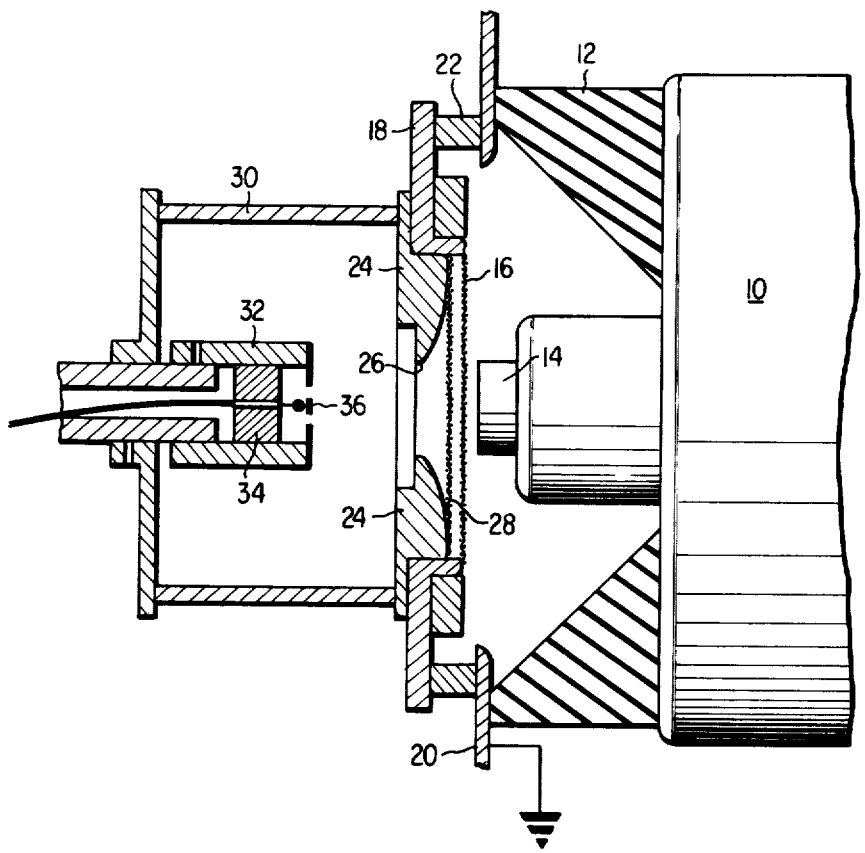

METHOD FOR CONTROLLING LOW-ENERGY HIGH CURRENT DENSITY ELECTRON BEAMS

RIGHTS OF THE GOVERNMENT

The invention described herein may be manufactured, used and licensed by or for the U.S. Government for Governmental purposes without the payment to us of any royalty thereon.

BACKGROUND OF THE INVENTION

1. Field of the Invention

The present invention relates to a method and apparatus for controlling electron beams, and more particularly to a method and apparatus for controlling the average angle of incidence of low-energy, high current density relativistic electron beams.

2. Description of the Prior Art

In the development of pulsed relativistic electron beams of very high current density, a major problem existing in the past was characterization of the properties and the behavior of the electrons in the beam such that an accurate calculation could be made of the electron deposition in a sample exposed to such a beam. The energy range of the beams in question lies from a few Kev up to approximately 100 Kev, since in this energy range, considered a low energy range in terms of relativistic electron beams, strong interactions occur among the electrons which cause unpredictible beam behavior patterns. At significantly lower energies and at substantially higher energies the same problems either do not exist or are substantially negated by extremely high electron velocities and energies.

A specific problem area exists in the control of an electron beam, in the energy range mentioned above, which is freely drifting in a vacuum. The behavior of such a beam as it drifts through a vacuum is strongly affected by electromagnetic interactions between the electrons and by the magnetic field forces generated by the electron current, which force electrons to move in directions transverse to the beam propagation direction. The result is that electrons will eventually reach a target zone unknown angles of incidence. Since it is desirable in many experimental uses of such beams to calculate the energy deposition profile of the beam, knowledge of the angle of incidence of the electrons is extremely important since an accurate energy deposition profile cannot be determined without accurate knowledge of the average angle of incidence of the electrons. The angle of incidence of electrons in drifting beams of the type described has generally been unknown in the past, so that no satisfactory experiments could be carried out which required an accurate determination of the energy deposition profile.

A number of techniques for attempting to control the average angle of incidence of such electron beams have been unsuccessfully attempted. For example, it has been determined that changing the profile of the boundary walls surrounding a drifting electron beam of the type described does not permit any control of the average electron angle of incidence. Furthermore, it has been determined that the use of charged dielectric boundary walls surrounding the drifting beam does not permit control of the angle of incidence, because electron beams are unable to drift in a reproducible manner in such an environment. Complex schemes such as changing the parameters of beam-generating diodes, or repositioning target zones relative to the diodes along with the use of beam fluence attenuators have all been considered in the past. However, such techniques are considered impractical since it would be unlikely that all combinations of machine diode parameters would provide good reproducible beams which could be reliably used for experimental purposes. Furthermore, modifications of beam generating diode parameters would inherently mean use of several beams with somewhat differing electron energy spectra, thereby imposing an undesirable variation among the beams to be used.

SUMMARY OF THE INVENTION

Accordingly, one object of this invention is to provide a novel method for controlling low-energy, high current density relativistic electron beams.

Another object of the present invention is the provision of a novel method for controlling the average angle of incidence of electrons in low-energy, high current density relativistic electron beams.

Yet another object of the present invention is the provision of a novel apparatus for controlling the average angle of incidence of electrons in low-energy, high current density relativistic electron beams.

Briefly, these and other objects of the present invention are accomplished by providing an auxiliary screen electrode maintained at ground potential between the anode electrode of a beam generating diode and a target. The position of the auxiliary electrode relative to the anode screen of the generating diode and the target may be adjusted for adjusting the average angle of incidence of electrons in low-energy, high current density relativistic electron beams generated by the diode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

The FIGURE is a partially schematic cut-away side view of one embodiment of the apparatus of the present invention.

DESCRIPTION OF THE PREFERRED EMBODIMENTS

Referring now to the drawings, the apparatus of the present invention will now be described in detail. A conventional mounting shank 10 is illustrated for supporting the apparatus of the present invention. It is to be understood that the illustrated apparatus is mounted within an evacuated environment. An insulating ring having a generally frusto-conically shaped interior aperture is secured to an outer face of the mounting shank 10. At the center of the aperture defined by the insulating ring 12 is mounted a cathode 14 to which is coupled a conventional high voltage (i.e. on the order to 90 kV) voltage source (not shown).

A mesh anode 16 is positioned in front of the cathode 14 and is secured to and held in position by an anode holder 18 formed of a conductive material. A conductive ground plate 20 which is maintained at a suitable reference potential such as ground, is secured to the anode holder by a conductive linking member 22 whereby the mesh anode 16 is maintained at ground potential. A guide cone 24 is secured to the anode holder 18 and defines a central opening 26 through which the electron beam passes. The guide cone 24, which is of a generally annular shape, is preferably constructed of metal (brass in this case) and serves to minimize shot-to-shot variations in beam position, size, uniformity or total energy.

An auxiliary mesh electrode 28 which is employed in accordance with the present invention is shown engaging the surface of the guide cone facing cathode 14. The position of the auxiliary electrode may be adjusted, as will be explained in more detail subsequently.

A beam target enclosure 30 is coupled to the rear surface of the anode holder and guide cone structure and serves to enclose a target holder 32. A conventional calorimeter 34 is mounted within the target holder and engages a target element 36 for measuring absorption of the target element.

Returning again to the auxiliarly mesh electrode 28, it is pointed out that this electrode is preferably a grounded metal screen formed of tungsten or a suitable equivalent material and preferably being between 35 and 70% transmitting. In general, a screen of this type is more opaque to electrons with a large transverse velocity component than to electrons with a relatively small transverse velocity component. Accordingly, the screen will tend to reduce transmission of electrons having large transverse velocity components. The changed electrical configuration of the drift region may also be an aid in reducing the transverse components. Positioning of the auxiliary electrode 28 in the illustrated apparatus is important. If the electrode is positioned too close to the anode 16, it will simply attenuate the output beam withot altering its properties in the desired manner. The auxiliary electrode is preferably positioned at a point where the internal forces within the drifting beam have become apparent, that is, where the beam has begun to "pinch". Typically, this position will be at about 0.2 inches of drift instance for an electron beam having 25 to 30 Kev average energy and having 10 to 15 kiloamp peak current in order to provide an average electron angle of incidence of about 45° at a target positioned 0.4 inches behind the auxiliary electrode. Smaller average angles of incidence are obtainable by moving the auxiliary electrode closer to the target position, while large averge angles of incidence are obtained by moving the auxiliary electrode closer to the anode 16.

The main significance of the present invention lies not so much in the fact that it can be used to adjust the average angle of incidence of drifting electrons in a relativistic beam having relatively low energy electrons and high current density, but rather in the fact that it permits maintaining a constant known average angle of incidence. Knowledge of the average angle of incidence is important in a number of kinds of experimental studies, such as those involving damage phenomena, since one cannot accurately determine the energy deposition profile of a substance without knowing the average angle of incidence of impinging electrons. In other words, electron penetration of a target, which determines the energy deposition profile, is highly dependent upon the average angle of incidence of electrons. Thus the method and apparatus of the present invention permits one to maintain a constant angle of incidence so that reliable and reproducible experimental procedures can be carried out.

Determination of the average angle of incidence produced by a given auxiliary electrode position may be accomplished as follows. An experimental energy deposition profile is obtained by inserting thin aluminum foils into the electron beam at the position of the target element 36, and measuring the charge transmitted through these foils by conventional techniques. By incrementally increasing the foil thickness, a charge deposition profile is obtained which is compared with that calculated using the known energy spectrum of the electron beam. The energy deposition profile is then calculated experimentally a number of times using different arbitrarily selected values of the angle of incidence. These calculations may, for example, be carried out by computer so that they may be conducted very rapidly. The calculations are carried out for differing values of the angle of incidence until the closest match to the experimentally determined energy deposition profile is found. This value is then interpreted to be the average angle of incidence of the beam electrons.

We wish it to be understood that we do not desire to be limited to the exact details of constructed shown and described, for obvious modifications can be made by a person skilled in the art.

What is claimed as new and desired to be secured by Letters Patent of the U.S. is:

1. A method of controlling the angle of incidence of electrons in low energy, high current density, pulsed relativistic electron beams comprising the steps of:
   producing a freely drifting electron beam;
   placing a grounded mesh electrode in the path of said beam;
   said step of producing further includes the steps of accelerating an electron beam from a cathode electrode to an anode electrode through a significant potential difference; and,
   said step of placing includes the step of positioning said grounded mesh electrode between said anode and a target at a point where internal forces within the drifting beam have become apparent.

2. A method as in claim 1, wherein said step of locating further comprises the step of:
   positioning said auxiliary electrode where said beam has begun to pinch.

3. A method as in claim 2, wherein said step of positioning further comprises the step of:
   locating said auxiliary electrode at approximately 0.2 inches of drift distance when said electron beam is in the range of from 25 to 30 kev and 10 to 15 kiloamp peak current.

4. An apparatus for controlling the angle of incidence of electrons in low energy, high current density, pulsed relativistic electron beams comprising:
   diode means for producing a drifting electron beam;
   auxiliary electrode means coupled to said diode means and positioned within the path of said drifting electron beam at a point where internal forces within the drifting beam have become apparent;
   said diode means includes a cathode electrode and an anode electrode, said anode electrode comprising a grounded mesh electrode for transmitting a beam of electrons from said cathode; and
   said auxiliarly mesh electrode is grounded and is positioned near said mesh anode on the opposite side thereof relative to said cathode.

5. An apparatus as in claim 4 further comprising:
   a guide cone element defining a beam aperture; and,
   a target positioned in the path of said beam at a distance from said auxiliary electrode means.

6. An apparatus as in claim 4, wherein:
   said auxiliary electrode engages and is in electrical contact with said guide cone.

* * * * *